(12) United States Patent
Hwang et al.

(10) Patent No.: US 7,226,829 B2
(45) Date of Patent: Jun. 5, 2007

(54) METHOD FOR FABRICATING SEMICONDUCTOR DEVICE

(75) Inventors: Chang-Youn Hwang, Kyoungki-do (KR); Dong-Sauk Kim, Kyoungki-do (KR); Jin-Ki Jung, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 79 days.

(21) Appl. No.: 10/749,533

(22) Filed: Dec. 30, 2003

(65) Prior Publication Data

US 2004/0180494 A1 Sep. 16, 2004

(30) Foreign Application Priority Data

Mar. 14, 2003 (KR) ............ 10-2003-0016020

(51) Int. Cl.
*H01L 21/8238* (2006.01)
(52) U.S. Cl. ............................ 438/210; 438/255
(58) Field of Classification Search ........... 438/210, 438/255
See application file for complete search history.

(56) References Cited

U.S. PATENT DOCUMENTS

| 6,096,595 A | * | 8/2000 | Huang | 438/238 |
| 6,177,320 B1 | * | 1/2001 | Cho et al. | 438/279 |
| 6,255,224 B1 | | 7/2001 | Kim | |
| 6,316,368 B1 | | 11/2001 | Lin et al. | |
| 6,369,446 B1 | * | 4/2002 | Tanaka | 257/758 |
| 6,461,911 B2 | * | 10/2002 | Ahn et al. | 438/253 |
| 6,511,919 B1 | * | 1/2003 | Park et al. | 438/723 |
| 6,555,481 B2 | * | 4/2003 | Nakamura | 438/734 |
| 2005/0064727 A1 | * | 3/2005 | Lee et al. | 438/781 |

* cited by examiner

*Primary Examiner*—Howard Weiss
*Assistant Examiner*—Shrinivas H. Rao
(74) *Attorney, Agent, or Firm*—Townsend and Townsend and Crew LLP

(57) ABSTRACT

The present invention is related to a method for forming a storage node of a semiconductor device. The method includes the steps of: (a) forming a plurality of bit line patterns, each including a wire and a hard mask sequentially stacked on a surface of a substrate structure; (b) sequentially forming a first barrier layer and a first inter-layer insulation layer along a profile containing bit line patterns until filling spaces between the bit line patterns; (c) etching the first inter-layer insulation layer until a partial portion of the first inter-layer insulation layer remains on each space between the bit line patterns; (d) forming a second barrier layer on the first inter-layer insulation layer and the first barrier layer; and (e) etching the first and the second barrier layers and the remaining first inter-layer insulation layer to expose a surface of the substrate structure disposed between the bit line patterns.

24 Claims, 15 Drawing Sheets

OPENING AREA

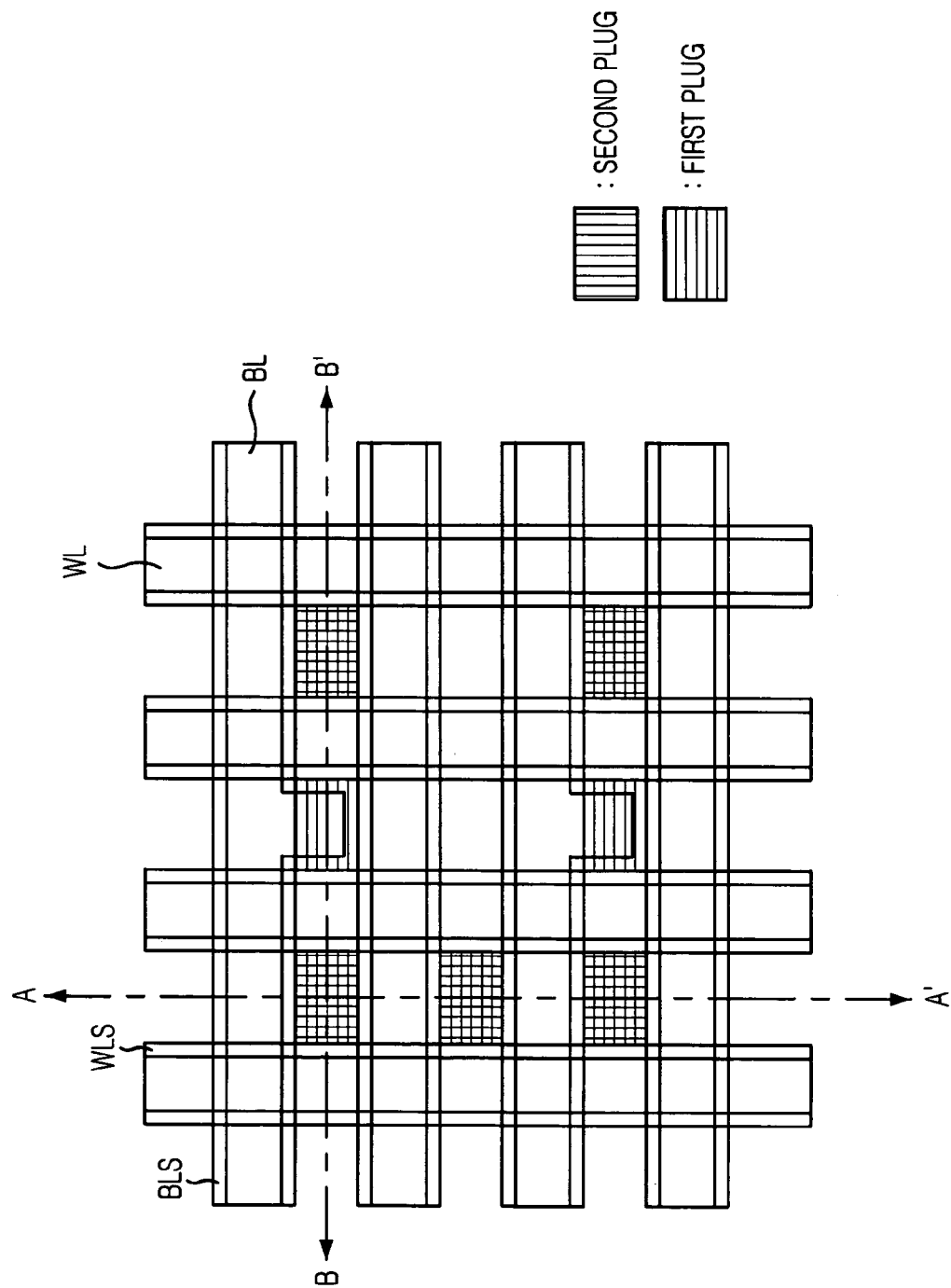

METHOD FOR FABRICATING SEMICONDUCTOR DEVICE

FIELD OF THE INVENTION

The present invention relates to a method for fabricating a semiconductor device; and, more particularly; to a method for fabricating a semiconductor device through a self-aligned contact (SAC) etching process.

DESCRIPTION OF RELATED ARTS

As a semiconductor device has been highly integrated, a space between conductive line patterns has been also narrowed. This narrowed space between conductive line patterns causes contact process margins to be decreased. Thus, a self-aligned contact (SAC) process is adopted to secure sufficient contact process margins. In the conventional SAC process, a barrier nitride layer is used to increase the contact process margins.

FIG. 1A is a top view of a conventional semiconductor device. As shown, island-type activation regions are formed in a substrate. A plurality of word lines WL are formed on the substrate, and a plurality of first plugs are formed on the active regions disposed between the word lines WL. A plurality of bit lines BL are formed on each space between the first plugs in a direction of crossing the word lines WL. A plurality of second plugs vertically connected to the first plugs are formed. Herein, the second plugs are plugs for storage node contacts, while the first plugs are plugs for making a contact to the bit lines BL and the second plugs. The word lines WL and the bit lines BL have word line spacers WLS and bit line spacers BLS, respectively.

FIG. 1B is a cross-sectional view of FIG. 1 in a direction of the line A–A'. FIG. 1C is a cross-sectional view of FIG. 1 in a direction of the line B–B'.

Referring to FIGS. 1B and 1C, a conventional method for fabricating a semiconductor device will be described in detail. A plurality of field oxide layers 12 defining island-type active regions are formed in a substrate 11. A plurality of word lines 13 are formed on the substrate 11. At this time, a word line spacer 14 is formed at sidewalls of each word line 13. Then, a first inter-layer insulation layer 15 is formed on the word lines 13. The first inter-layer insulation layer 15 is then etched to form contact holes for forming first plugs (hereinafter referred to as a first plug contact hole). The first plug contact holes are filled with a conductive material and are subsequently subjected to a chemical mechanical polishing (CMP) process, whereby a plurality of first plugs 16A and 16B are formed.

Next, a second inter-layer insulation layer 17 is formed on the first plugs 16A and 16B and the first inter-layer insulation layer 15. Afterwards, the second inter-layer insulation layer 17 is etched to form bit line contact holes (not shown) opening each surface of a group of the first plugs 16A contacted to the bit lines. Then, a barrier metal layer 18 is deposited into each of the bit line contact holes. On the barrier metal layer 18, a bit line wire 19 and a bit line hard mask 20 are sequentially stacked to form a bit line pattern. Herein, a plurality of bit line patterns are formed. A barrier layer 21 is formed over an entire surface of the resulting structure including the bit line patterns.

A third inter-layer insulation layer 22 is formed over a surface of the structure including the bit line patterns and the barrier layer 21. Then, the third inter-layer insulation layer 22, the barrier layer 21 and the second inter-layer insulation layer 17 are etched with use of a photosensitive storage node contact mask 23 so that storage node contact holes 24 opening each surface of a group of the first plugs 16B are formed.

The storage node contact holes 24 is opened by using a direct contact etching process from a top part of the bit line pattern to a shoulder part of the bit line pattern, while a SAC etching process is employed from the shoulder part to a bottom part of the bit line pattern.

Also, based on a careful consideration of a design rule on margins resulted from large-scale of integration of a semiconductor device, a line-type contact is preferable to a hole-type contact during a process for forming SACs.

FIG. 1D is a top view of a semiconductor device wherein a line-type contact mask is used. In case of employing the storage node contact mask 23 having a line-type, it is possible to secure mask overlay margins; however, there is a problem of inducing a failure of self-aligned contacts due to decreased selectivity to the barrier layer 21 during the SAC etching process. That is, critical dimension (CD) of the bit line and aligning margins have been progressively reduced due to large-scale of integration, the SAC etching process is preferably employed for forming the storage node contacts because of its high selectivity to the bit line. However, at this time, a nitride layer used as the barrier layer 21, however, damages the bit line hard mask 20 since the nitride layer is not capable of acting as an etch barrier layer. As a result of this dysfunction, there arise further problems of poor quality of the bit line patterns and bridge formations between the bit line wire and the storage node contact. These problems are illustrated in FIG. 2A.

In case of increasing the thickness of the barrier layer 21 to solve the aforementioned problems, the process margin is decreased while an aspect ratio is increased. Hence, a SAC etching process margin is decreased. Furthermore, the increase in the aspect ratio induces generations of void during the deposition of the third inter-layer insulation layer 22 so that a device characteristic is consequently degraded in the end.

Also, when the storage node contact hole 24 is formed by etching the thick third inter-layer insulation layer 22 at once, the storage node contact hole 24 has an inclined profile, resulting in a narrower opening area. This problem is shown in FIGS. 2B and 2C.

A wet cleaning/etching process is performed after the formation of the storage node contact hole 24 to increase an area of the narrowed opening. However, wet chemicals used for the wet cleaning/etching process may attack the bottom layers to thereby induce a functional failure of a device.

SUMMARY OF THE INVENTION

It is, therefore, an object of the present invention to provide a method for fabricating a semiconductor device capable of preventing damages to a bit line hard mask during an etching process for forming a storage node contact.

It is another object of the present invention to provide a method for fabricating a semiconductor device capable of preventing bottom layers from being attacked by wet chemicals during a wet cleaning/etching process for securing a sufficient opening area of a storage node contact.

In accordance with an aspect of the present invention, there is provided a method for forming a storage node of a semiconductor device, including the steps of: (a) forming a plurality of bit line patterns, each including a wire and a hard mask sequentially stacked on a surface of a substrate structure; (b) sequentially forming a first barrier layer and a first inter-layer insulation layer along a profile containing bit line patterns until filling spaces between the bit line patterns; (c) etching the first inter-layer insulation layer until a partial portion of the first inter-layer insulation layer remains on each space between the bit line patterns; (d) forming a second barrier layer on the first inter-layer insulation layer and the first barrier layer; and (e) etching the first and the second barrier layers and the remaining first inter-layer insulation layer to expose a surface of the substrate structure disposed between the bit line patterns.

In accordance with another aspect of the present invention, there is provided a method for fabricating a semiconductor device, including the steps of: (a) forming a plurality of bit line patterns, each including a wire and a hard mask sequentially stacked on a surface of a substrate structure; (b) sequentially forming a first barrier layer and a first inter-layer insulation layer along a profile containing bit line patterns until filling spaces between the bit line patterns; (c) etching the first inter-layer insulation layer until a partial portion of the first inter-layer insulation layer remains on each space between the bit line patterns; (d) forming a second barrier layer on the first inter-layer insulation layer and the first barrier layer; and (e) etching the first and the second barrier layers and the remaining first inter-layer insulation layer to expose a surface of the substrate structure disposed between the bit line patterns.

BRIEF DESCRIPTION OF THE DRAWING(S)

The above and other objects and features of the present invention will become apparent from the following description of the preferred embodiments given in conjunction with the accompanying drawings, in which:

FIG. 3 is a top view of a semiconductor device fabricated in accordance with a preferred embodiment of the present invention;

DETAILED DESCRIPTION OF THE INVENTION

Hereinafter, a method for fabricating a semiconductor device in accordance with the present invention will be described in detail with reference to the accompanying drawings.

FIG. 3 is a top view of a semiconductor device fabricated in accordance with a preferred embodiment of the present invention. FIGS. 4A to 4E are cross-sectional views of the semiconductor device shown in FIG. 3 with respect to each direction of the lines A–A' and B–B'.

Figure 1A:
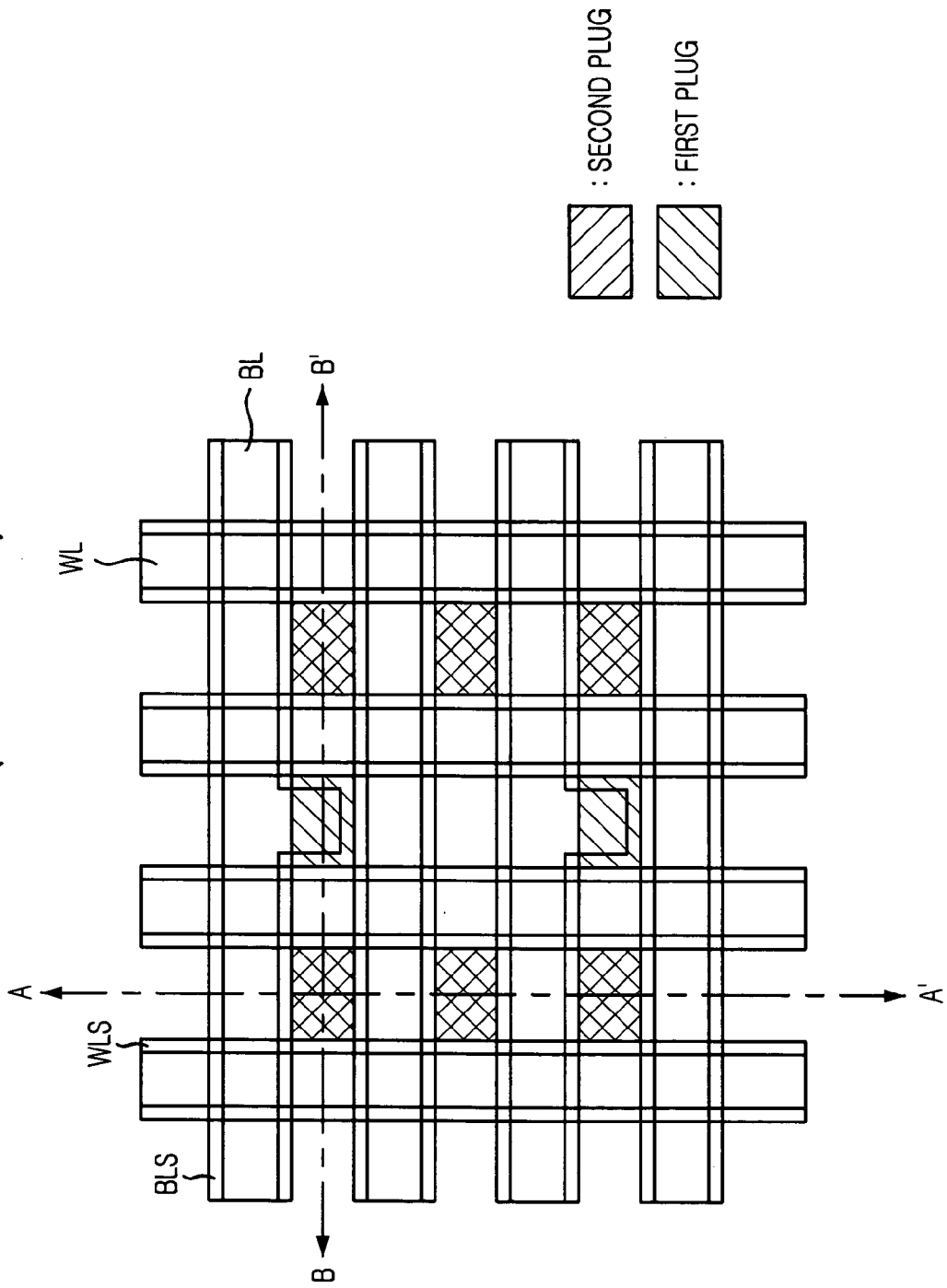
FIG. 1A is a top view of a conventional semiconductor device.
Figure 1B:
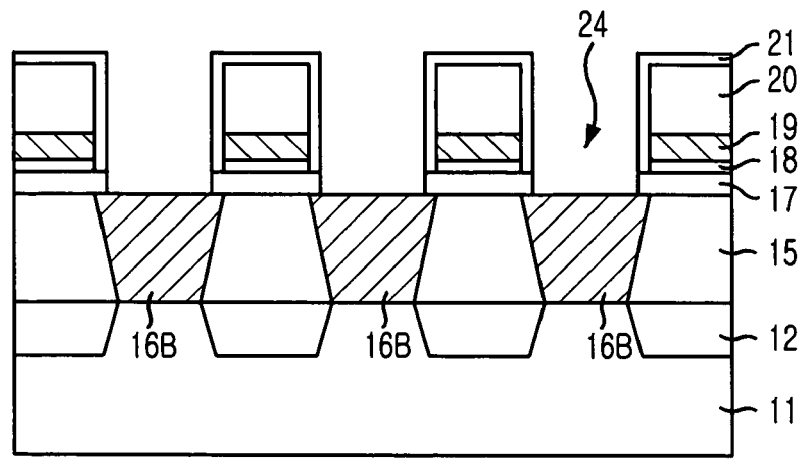
FIG. 1B is a cross-sectional view of FIG. 1A in a direction of the line A–A'.
Figure 1C:
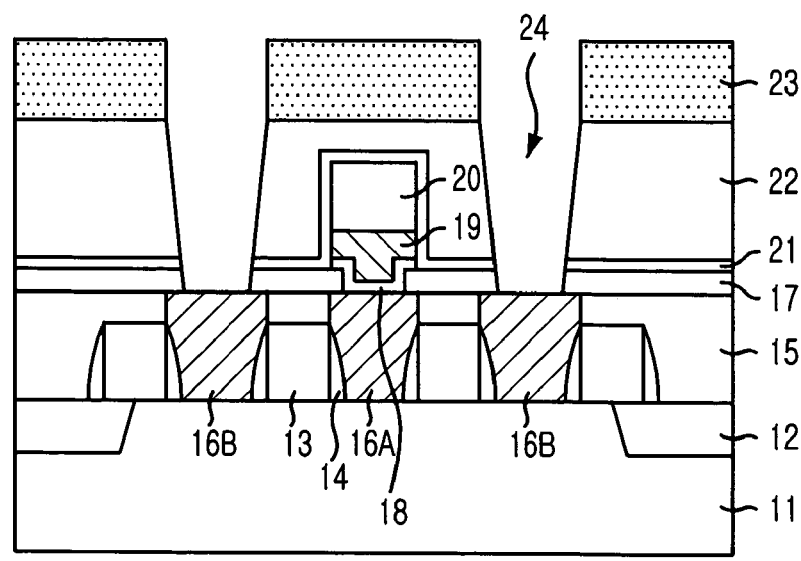
FIG. 1C is a cross-sectional view of FIG. 1A in a direction of the line B–B'.
Figure 1D:
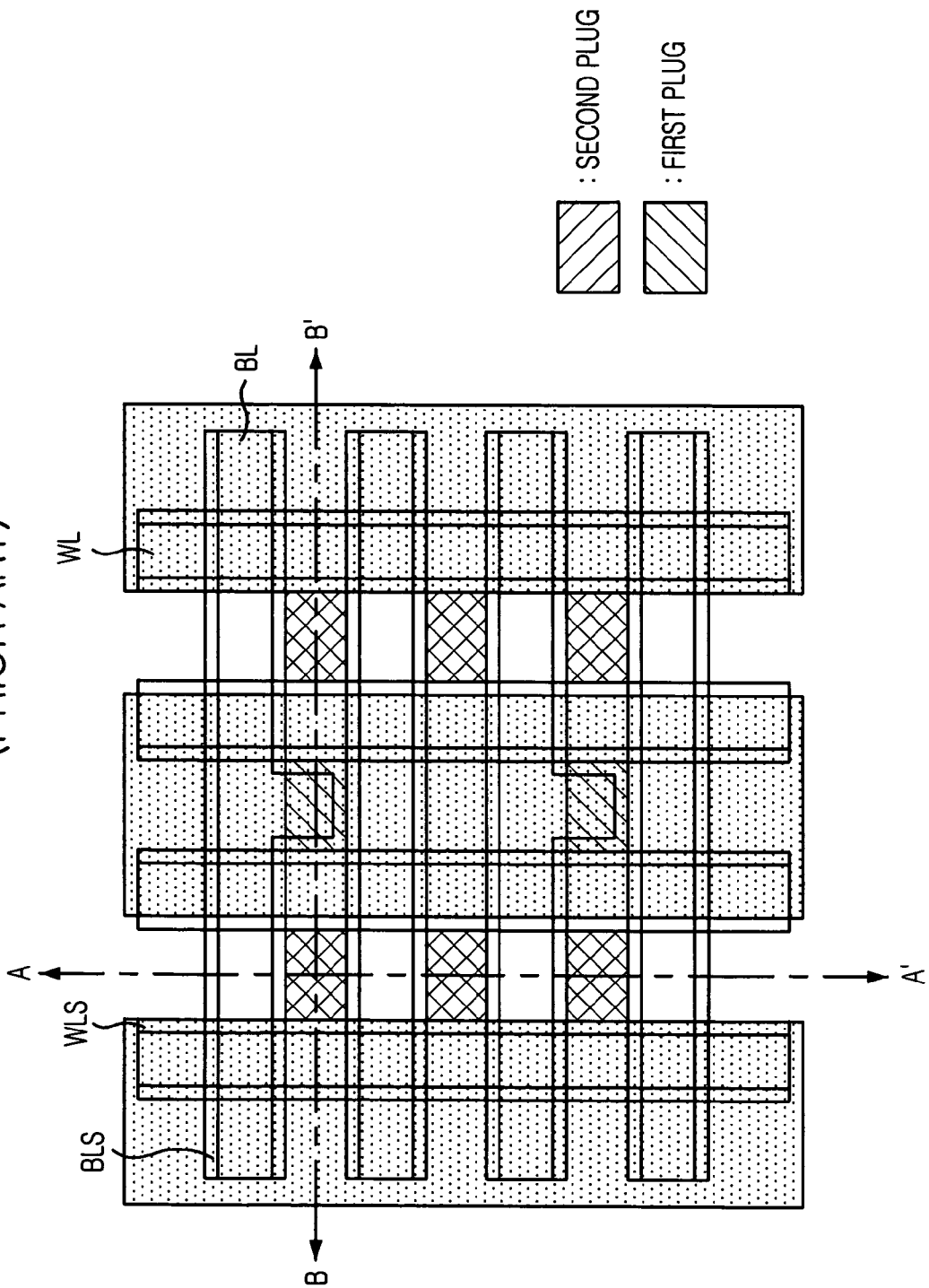
FIG. 1D is a top view of a conventional semiconductor device wherein a line-type contact mask is used.
Figure 2A:
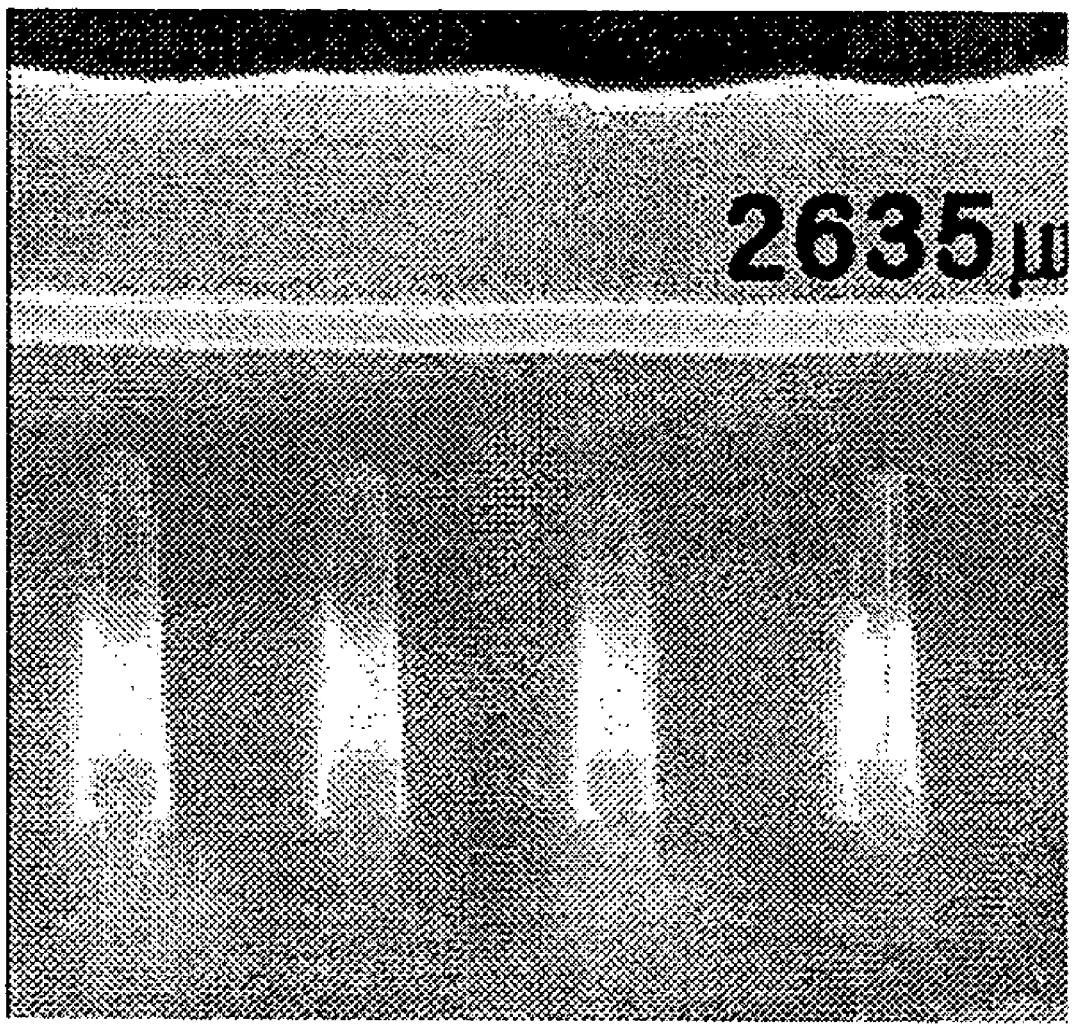
FIG. 2A is a micrograph showing poor quality of bit line patterns and bridges formed between the bit line pattern and a storage node contact.
Figure 2B:
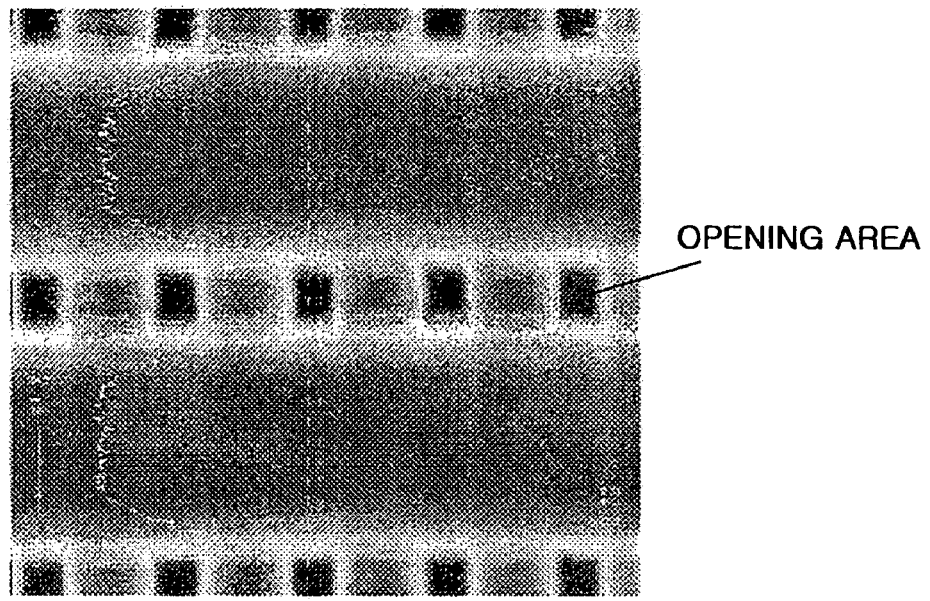
FIGS. 2B and 2C are micrographs showing an inclined profile of conventionally formed storage node contact holes.
Figure 2C:
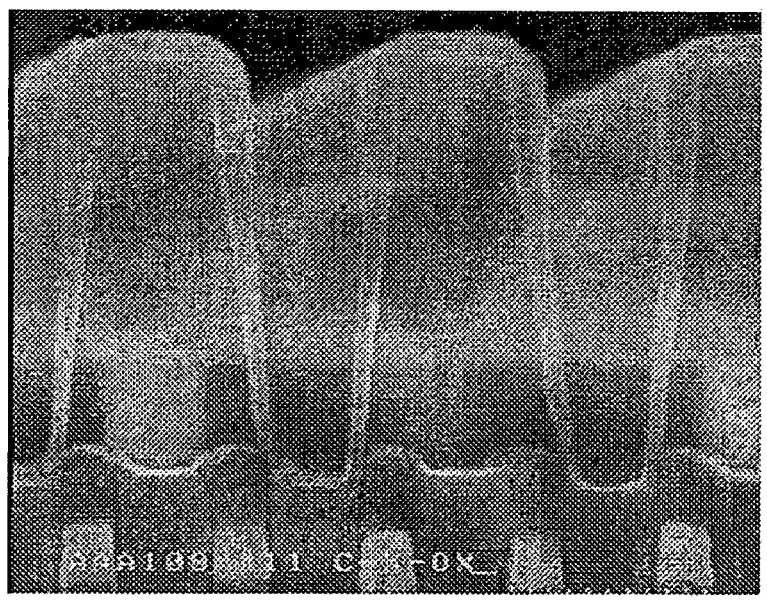
Figure 2D:
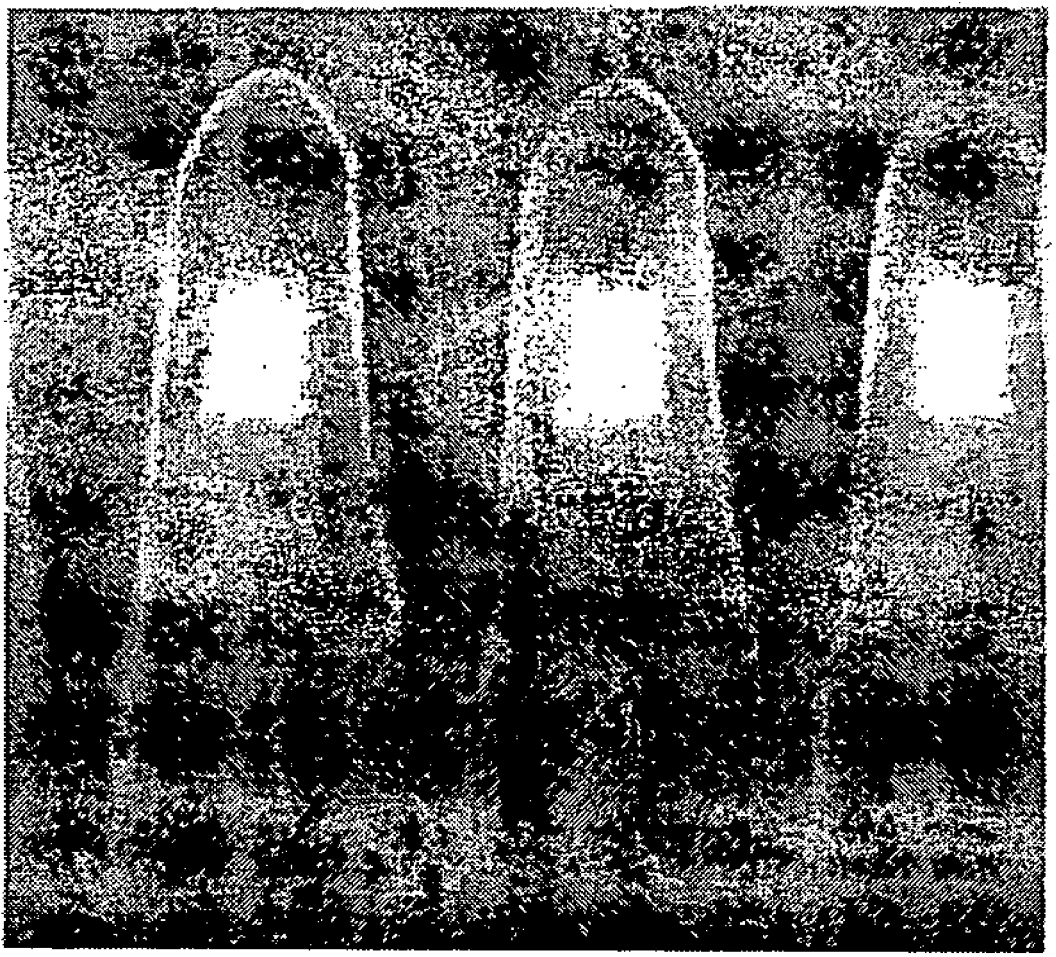
FIG. 2D is a micrograph illustrating bottom layers attacked by a wet chemical used for a conventional wet cleaning/etching process.
Figure 4A:
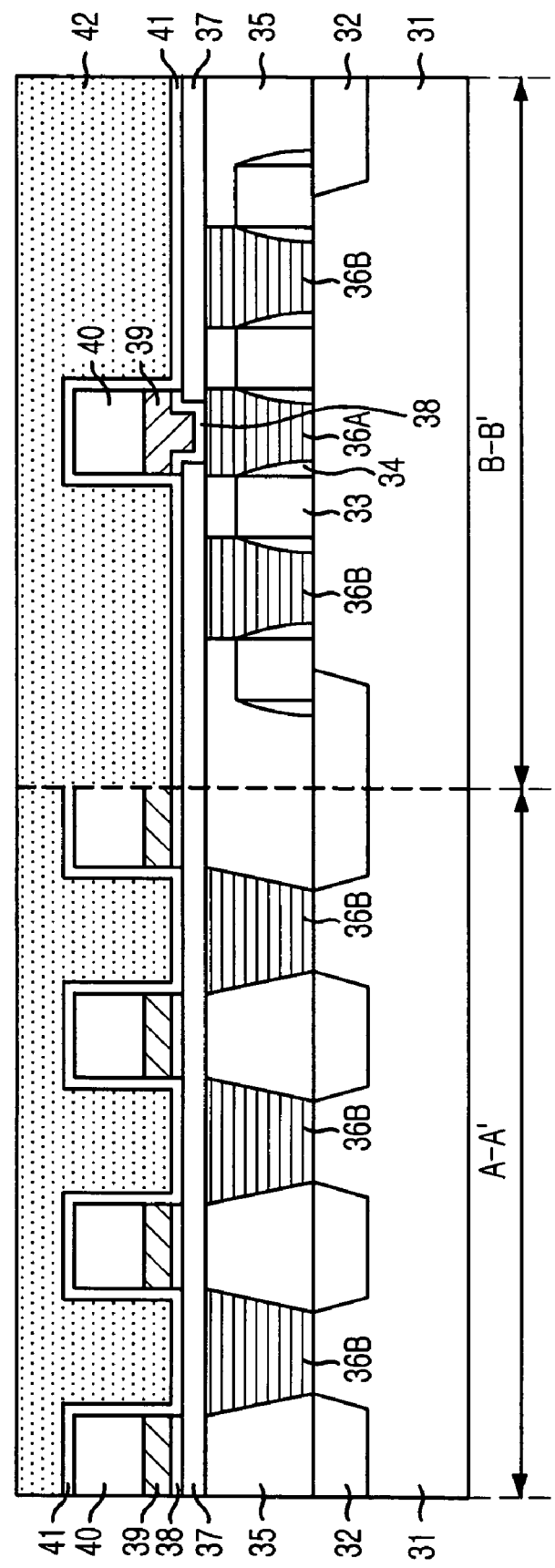
FIGS. 4A to 4E are cross-sectional views of the semiconductor device shown in FIG. 3.

Referring to FIG. 4A, a plurality of field oxide layers 32 are formed in a substrate 31, and a plurality of word lines 33 are formed on the substrate 31. At this time, a word line spacer 34 is formed at sidewalls of each word line 33. Then, a first inter-layer insulation layer 35 is formed on the above resulting structure. The first inter-layer insulation layer 35 is subsequently etched to form contact holes for forming first plugs 36A and 36B (hereinafter referred to as a first plug contact hole). A conductive material is filled into the first plug contact hole and is then subjected to a chemical mechanical polishing (CMP) process, whereby the first plugs 36A and 36B are formed. At this time, the first plugs 36A and 36B are made of polysilicon, and a group of the first plugs 36B is for storage node contacts while another group of the first plugs 36A is for bit line contacts.

Next, a second inter-layer insulation layer 37 is formed over the planarized first plugs 36A and 36B and the first inter-layer insulation layer 35. The second inter-layer insulation layer 37 is then etched to form bit line contact holes (not shown) opening the group of the first plugs 36A for making contacts to bit lines. A barrier metal layer 38 is deposited into each bit line contact holes. Then, a bit line wire 39 and a bit line hard mask 40 are stacked on the barrier metal layer 38 so that bit line patterns are formed. A first barrier layer 41 functioning as a bit line spacer is formed on an entire surface of the above structure including the bit line patterns. At this time, the first barrier layer 41 has a thickness ranging from about 50 Å to about 300 Å. Also, the barrier metal layer 38 is made of titanium nitride (TiN), while the bit line wire 39 is made of tungsten (W). Both the bit line hard mask 40 and the first barrier layer 41 are formed with a nitride layer deposited at a low pressure.

Afterwards, a third inter-layer insulation layer 42 is deposited on the first barrier layer 41 until filling a space between the bit line patterns. At this time, the third inter-layer insulation layer 42 is deposited in two steps so that it is deposited without void generations under a consideration on an aspect ratio of the bit line patterns. For instance, a high density plasma (HDP) oxide layer is deposited in two steps until reaching a thickness ranging from about 5000 Å to about 10000 Å.

Figure 4B:
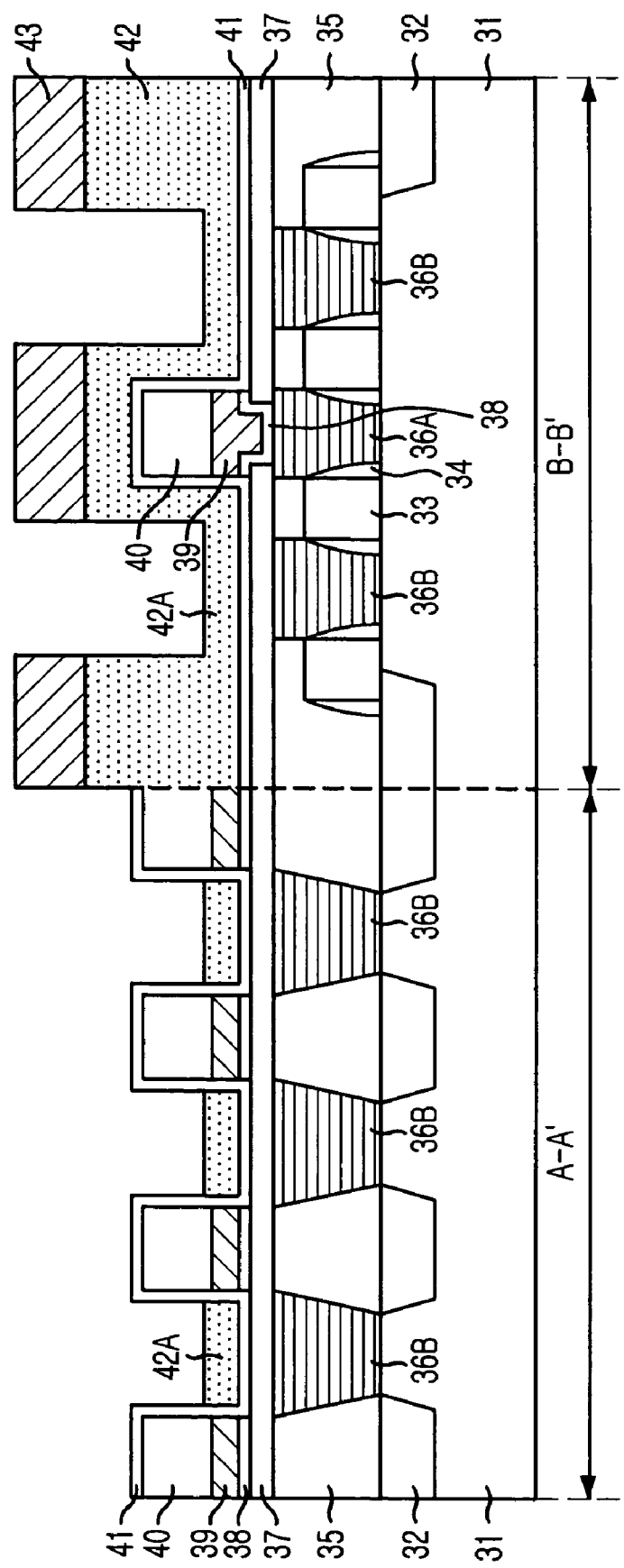

As shown in FIG. 4B, a line-type self-aligned contact (SAC) mask 43 is formed on the third inter-layer insulation layer 42. A partial SAC etching process is proceeded at first. For example, with use of the SAC mask 43 as an etch mask, the third inter-layer insulation layer 42 is etched in such a manner that a partial portion 42A of the third inter-layer insulation layer 42 remains in a thin thickness on the first barrier layer 41 disposed between the bit line patterns. The targeted thickness of the remaining third inter-layer insulation layer 42A ranges from about 1500 Å to about 5000 Å. That is, the remaining third inter-layer insulation layer 42A is etched to a level to the height of the bit line wire 39.

Herein, the third inter-layer insulation layer 42 remaining on an upper part of the bit line pattern has the same initial deposition thickness.

Meanwhile, the first SAC etching process is carried out at a pressure of about 15 mtorr to about 50 mtorr with a supplied power ranging from about 1000 W to about 2000 W. Also, the first SAC etching process uses an etch gas obtained by combining such gas as $C_4F_8$, $C_5F_8$, $C_4F_6$, $CH_2F_2$, Ar, $O_2$, CO, $N_2$.

Figure 4C:
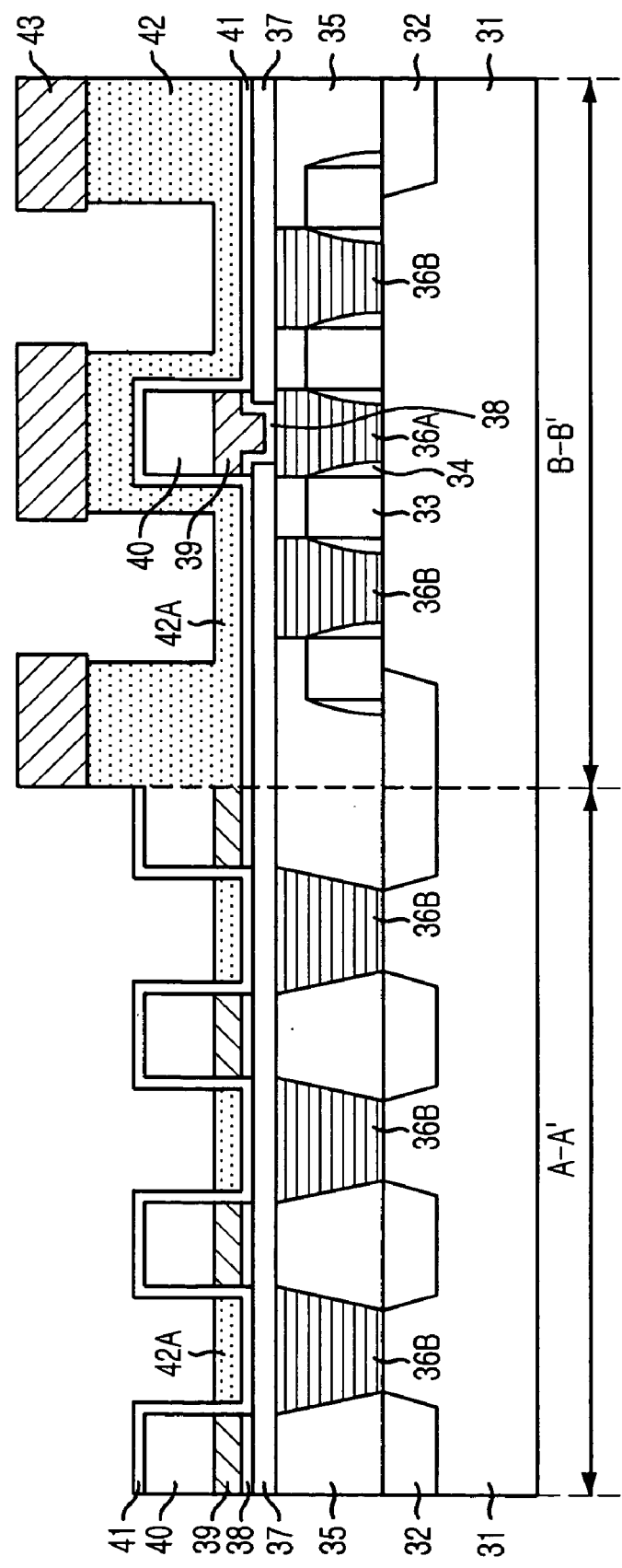

Referring to FIG. 4C, a wet cleaning/etching process is performed by using buffered oxide etchant (BOE) to remove polymers produced during the SAC etching process. At this time, BOE is obtained by mixing $H_2SO_4$ with $H_2O_2$ in a ratio of about 300 to about 1. Through this wet cleaning/etching process, it is possible to extend an opening area of the storage node contact holes. Since this wet cleaning/etching process is carried out in a state that the first barrier layer 41 having an excellent barrier characteristic, bottom layers, i.e., the second inter-layer insulation layer 37 and the first plugs 36A and 36B, are not attacked by the wet chemical such as BOE.

Figure 4D:
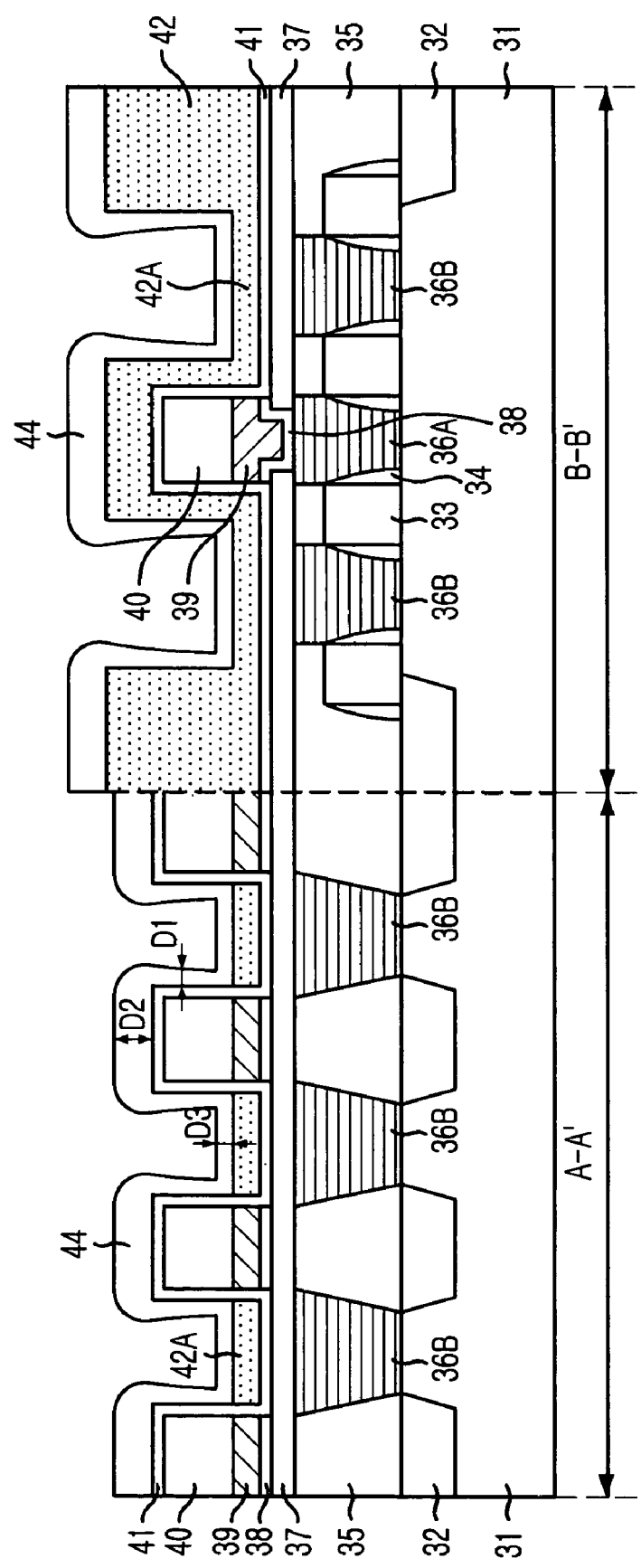

With reference to FIG. 4D, the SAC mask 43 is removed, and a second barrier layer 44 made of nitride is deposited on an entire surface of the above resulting structure by using a plasma enhanced (PE) technique. Hereinafter, the second barrier layer 44 is referred to as a PE nitride layer. At this time, the PE nitride layer 44 has an overhang structure to protect the bit line patterns as simultaneously as to secure margins of the bit line hard mask 40. Also, the deposition of the PE nitride layer 44 is deposited by using a source gas of silane/ammonia ($SiH_4$/$NH_3$) at a temperature ranging from about 500° C. to about 550° C. In addition, a thickness of the PE nitride layer 44 is in a range from about 500 Å to about 2000 Å.

Unlike a nitride layer formed at a low pressure, the PE nitride layer 44 has a poor step coverage characteristic. That is, the PE nitride layer 44 is more thickly deposited on an upper part, i.e., on an upper surface and corners of the bit line pattern, than at sidewalls of the bit line pattern. Also, the thickness $D_3$ of the PE nitride layer 44 deposited on a bottom part, i.e., on a surface of the remaining third inter-layer insulation layer 42A, is thinner than the thickness $D_2$ of the PE nitride layer 44 deposited on the upper part of the bit line pattern but thicker than the thickness $D_1$ of the PE nitride layer 44 deposited at the sidewalls of the bit line pattern. For instance, the step coverage ratio of the sidewalls of the bit line pattern to the upper part of the bit line pattern is about 0.5 to about 1, while the step coverage ratio of the bottom part of the bit line pattern to the sidewalls of the bit line pattern is about 0.5 to about 1. Particularly, as indicated by the step coverage ratio of the sidewalls to the upper part, which is about 0.5 to about 1, the thickness $D_2$ of the PE nitride layer 44 deposited on the upper part of the bit line pattern is twice of the thickness $D_1$ of the PE nitride layer 44 deposited at the sidewalls of the bit line pattern.

However, this poor step coverage characteristic can be improved by varying a power and a gas generating a plasma. Burdens on a deposition temperature can be also reduced during the deposition of the PE nitride layer 44 since it can be deposited at a temperature lower than about 200° C. from the deposition temperature of a nitride layer formed at a low pressure. The deposition temperature of the aforementioned nitride layer is about 760° C.

Figure 4E:
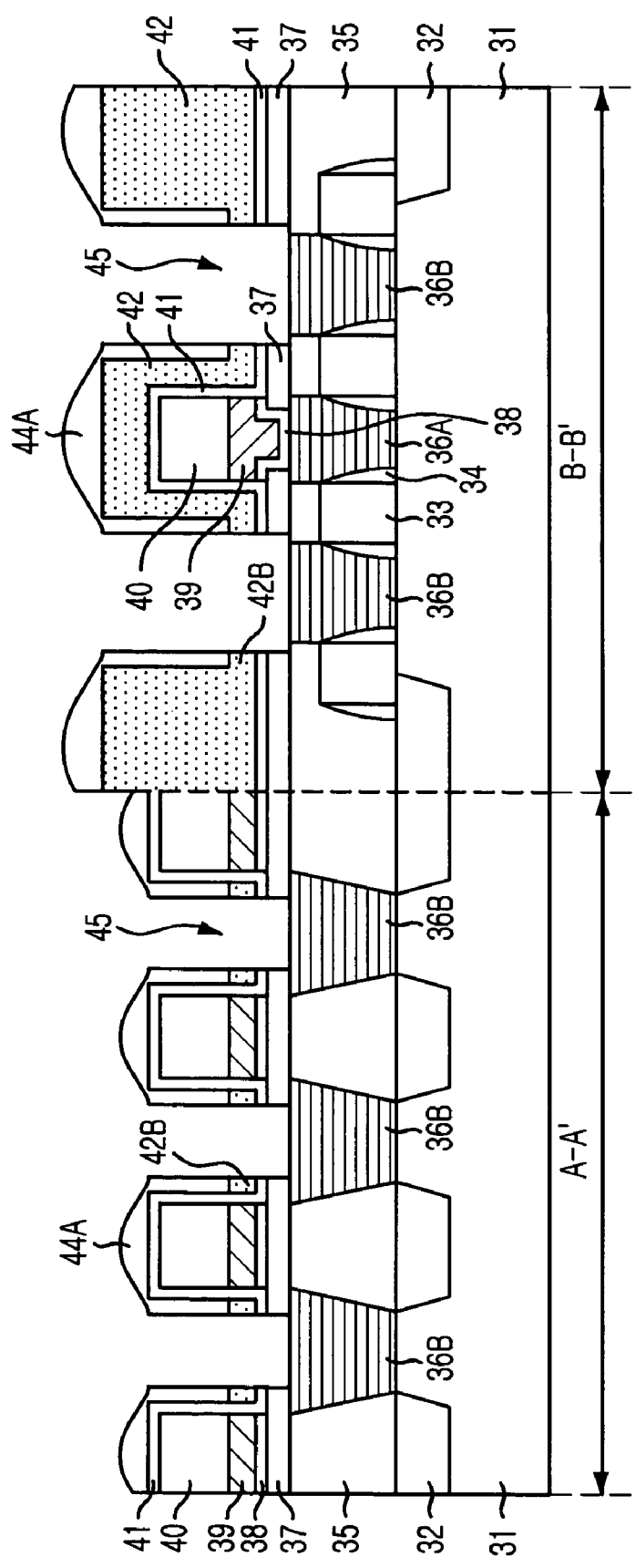

Referring to FIG. 4E, a second SAC etching process is performed by using the PE nitride layer 44 as a hard mask. For instance, the PE nitride layer 44 is subjected to an etch-back process that etches the upper part and the bottom part of the bit line pattern in much higher rate than the sidewalls of the bit line pattern. Through the usual etch-back process, the PE nitride layer 44 remains only at sidewalls of the bit line pattern. However, after this etch-back process, the PE nitride layer 44 remains on the upper part and at the sidewalls of the bit line pattern due to its characteristic deposition. In other words, since the thickness of the PE nitride layer 44 at the bottom part is thinner than that of the PE nitride layer 44 at the upper part, the PE nitride layer 44 remains on the upper part after the etch-back process when it is assumed that the etch ratio to the upper part and the bottom part is the same. Meanwhile, the PE nitride layer 44 remains at the sidewalls of the bit line pattern even if the PE nitride layer 44 is deposited more thinly at the sidewalls of the bit line pattern than at the upper part and the bottom part of the bit line pattern. The reason for this result is because the sidewall of the bit line pattern has a lower etch ratio than that of the upper part and the bottom part of the bit line pattern.

Also, the remaining third inter-layer insulation layer 42A having etch selectivity lower than that of the PE nitride layer 44, the first barrier layer 41 and the second inter-layer insulation layer 37 all disposed between the bit line patterns are simultaneously etched away through the etch-back process to thereby form storage node contact holes 45 completely opening surfaces of the group of the first plugs 36B. Herein, the first barrier layer 41 and the PE nitride layer 44 have the same etch selectivity, and thus, the first barrier layer 41 is etched away with the PE nitride layer 44 deposited on the surface between the bit line patterns.

The remaining PE nitride layer 44A on the upper part and the sidewalls of each bit line functions as a barrier layer during the second SAC etching process. Particularly, it protects the bit line hard mask 40 against damages so as to improve poor quality of bit line patterns.

Furthermore, since the PE nitride layer 44 is etched more at the upper part and the bottom part of the bit line patterns, the remaining PE nitride layer 44A at the sidewalls of the bit line patterns functions as an etch barrier layer during the etching of the remaining third inter-layer insulation layer 42A. Therefore, the third inter-layer insulation layer 42B (hereinafter referred to as a spacer third inter-layer insulation layer) remains as a spacer at the sidewalls of each bit line pattern. That is, a dual spacer including the first barrier layer 41 and the spacer third inter-layer insulation layer 42B is formed at both sidewalls of the barrier metal layer 38 and the bit line wire 39. At sidewalls of the bit line hard mask 40 seen in a direction of the line A–A', a dual spacer including the first barrier layer 41 and the remaining PE nitride layer 44A is formed, and the sidewalls of the bit line hard mask 40 seen in a direction of the line B–B' have a triple spacer including the first barrier layer 41, the third inter-layer insulation layer 42 and the remaining PE nitride layer 44A.

Additionally, the second SAC etching process is performed at a pressure of about 15 mtorr to about 50 mtorr with a power supplied in a range from about 1000 W to about 2000 W. At this time, an etch gas is used by combining such gas as $C_4F_8$, $C_5F_8$, $C_4F_6$, $CH_2F_2$, Ar, $O_2$, CO and $N_2$.

Compared to a case that a nitride-based layer remains as a spacer at sidewalls of the bit line patterns, the remaining spacer third inter-layer insulation layer 42B made of HDP oxide provides an additional effect that a bit line capacitance is reduced.

Figure 5:
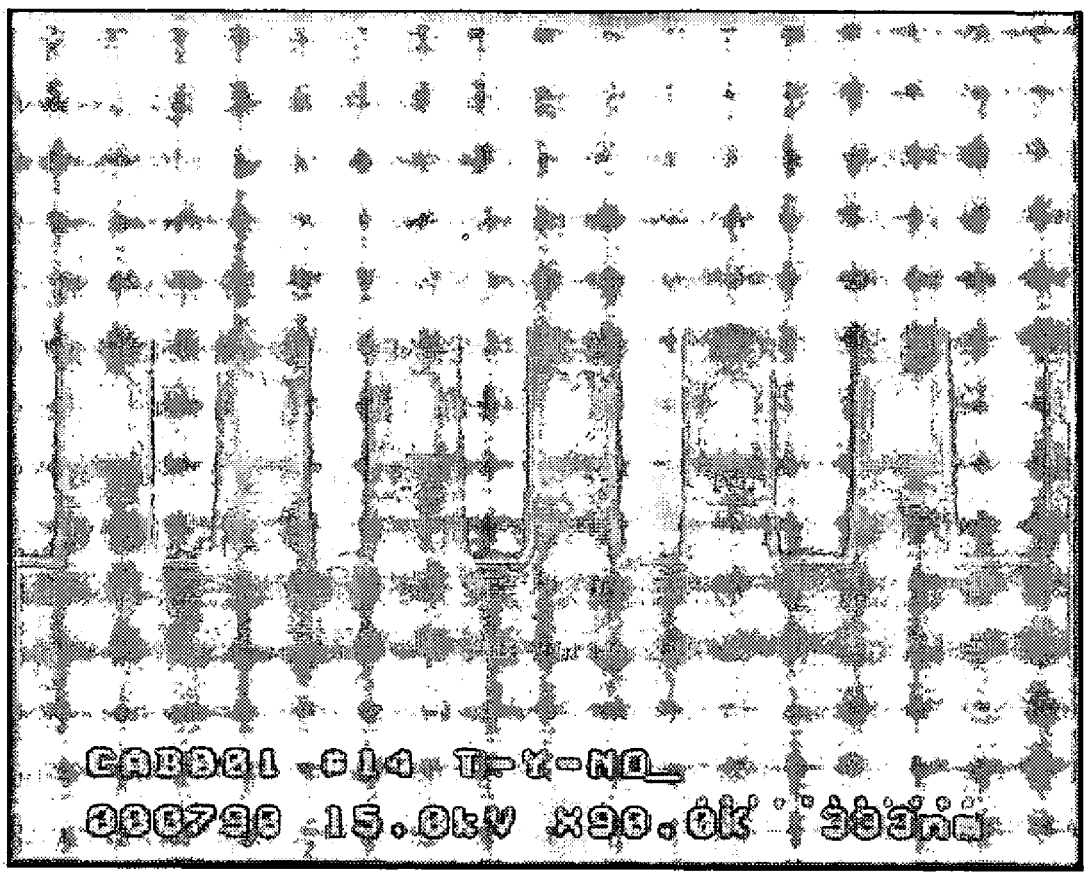
FIG. 5 is a micrograph showing a cross-sectional view of the semiconductor device viewed in a direction of the line A–A' of FIG. 3 after an etch-back process is performed to a plasma enhanced (PE) nitride layer.
Figure 6:
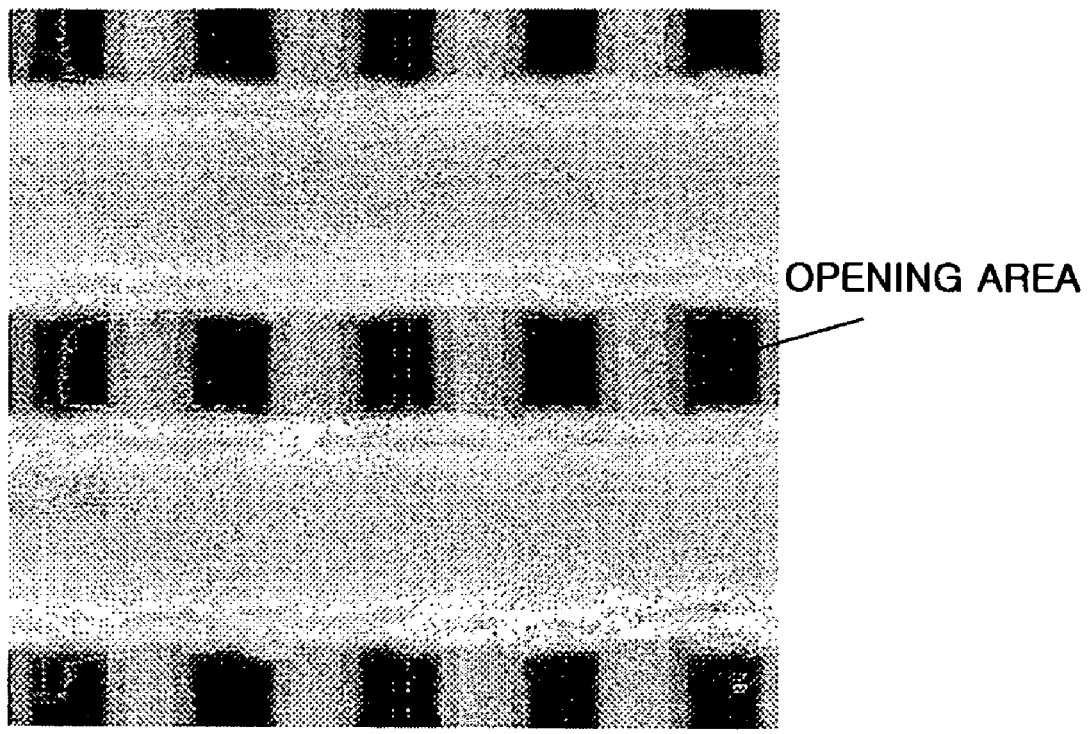
FIG. 6 is a micrograph showing a cross-sectional view of the semiconductor device viewed in a direction of the line B–B' of FIG. 3 after an etch-back process is performed to a PE nitride layer.

FIG. 5 is a micrograph showing a cross-sectional view of the semiconductor device of FIG. 3 viewed in a direction of the line A–A' after the etch-back process is performed to the PE nitride layer 44. FIG. 6 is a micrograph showing the semiconductor device of FIG. 3 viewed in a direction of the line B–B' after the etch-back process is performed to the PE nitride layer 44. The PE nitride layer 44 remains on the upper part of each bit line pattern with a uniform thickness so that the bit line hard mask 40 is not damaged and retains its structure. Also, the PE nitride layer 44 remains as a spacer at sidewalls of each bit line hard mask 40, and the spacer third inter-layer insulation layer 42B remains as a spacer at sidewalls of each bit line pattern. Also, the storage node contact holes 45 have a vertical profile.

Figure 7:
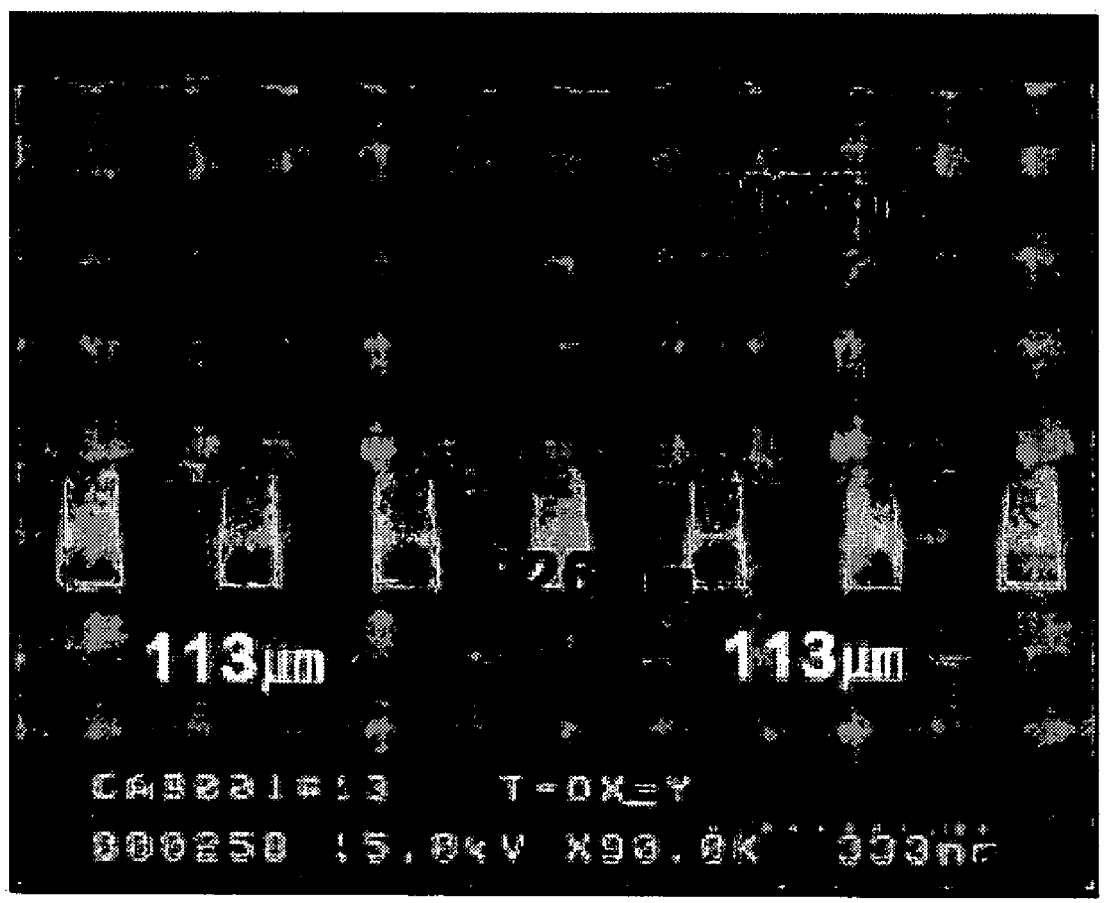
FIG. 7 is a micrograph showing a top view of the semiconductor device of FIG. 3 after an etch-back process is performed to a PE nitride layer.

FIG. 7 is a top view of the semiconductor device of FIG. 3 after the etch-back process is performed to the PE nitride layer 44. As shown, it is possible to secure a wide opening area compared to the opening area obtained by using the conventional method.

According to the preferred embodiment of the present invention, the PE nitride layer is precedently formed so that etch selectivity to the bit line hard mask is improved during the SAC etching process for forming the storage node contact holes. This improved etch selectivity further results in increased SAC etching process margins. Also, the bit line capacitance is improved by using an oxide layer as a spacer for the bit line. Furthermore, it is possible to prevent the bottom layers from being attacked by performing the wet cleaning/etching process prior to a complete opening of the storage node contact holes.

In addition, during the SAC etching process for forming the storage node contact holes, the PE nitride layer is solely used instead of using a photosensitive etch mask. As a result of this use of the PE nitride layer, generations of polymers are minimized so that a vertical etch profile is obtained. This vertical etch profile makes it possible to secure a maximum opening area of the storage node contact holes and to prevent poor quality of the contact openings.

While the present invention has been described with respect to certain preferred embodiments, it will be apparent to those skilled in the art that various changes and modifications may be made without departing from the scope of the invention as defined in the following claims.

What is claimed is:

1. A method for forming a storage node of a semiconductor device, comprising the steps of:
    (a) forming a plurality of bit line patterns, each including a wire and a hard mask sequentially stacked over a surface of a substrate structure;
    (b) forming a first barrier layer and a first inter-layer insulation layer along a profile containing the bit line patterns and filling spaces between the bit line patterns;
    (c) etching the first inter-layer insulation layer to define a trench between the bit line patterns, so that at least a partial portion of the first inter-layer insulation layer remains below the trench and over the first barrier layer between the bit line patterns, wherein a portion of the first barrier layer provided below the trench and between the bit line patterns is not exposed by the etching-the-first-inter-layer-insulation-layer step;
    (d) forming a second barrier layer over the first inter-layer insulation layer and the first barrier layer; and
    (e) etching the first and the second barrier layers and the partial portion of the first inter-layer insulation layer to expose a surface of the substrate structure disposed between the bit line patterns.

2. The method as recited in claim 1, further comprising the steps of performing a wet cleaning/etching process with use of the first barrier layer as an etch barrier layer after the step of (c).

3. The method as recited in claim 1, wherein the step of (c) includes the steps of:
    (c-1) forming a storage node contact mask on the second inter-layer insulation layer; and
    (c-2) performing a partial SAC etching process to the second inter-layer insulation layer with use of the storage node contact mask as an etch mask.

4. The method as recited in claim 3, wherein the partial SAC etching process is carried out at a pressure of about 15 mtorr to about 50 mtorr with a supplied power in range from about 1000 W to about 2000 W and employs an etch gas obtained by combining such gas as $C_4F_8$, $C_5F_8$, $C_4F_6$, $CH_2F_2$, Ar, $O_2$, CO and $N_2$.

5. The method as recited in claim 1, wherein the first barrier layer is formed by employing a low pressure technique and the second barrier layer is formed by employing a plasma deposition technique.

6. The method as recited in claim 5, wherein the second barrier layer is a nitride layer and the nitride layer is deposited with a thickness ranging from about 500 Å to about 2000 Å at a temperature in a range from about 500° C. to about 550° C. by using a source gas of silane ($SiH_4$) and ammonia (NH3).

7. The method as recited in claim 1, wherein the etch-back process employed for etching the second barrier layer is carried out at a pressure of about 15 mtorr to about 50 mtorr with a supplied power in a range from about 1000 W to about 2000 W and employs an etch gas obtained by combining such gas as $C_4F_8$, $C_5F_8$, $C_4F_6$, $CH_2F_2$, Ar, $O_2$, CO and $N_2$.

8. The method as recited in claim 1, wherein the substrate structure includes a plurality of plugs formed on a substrate and a second inter-layer insulation layer.

9. The method as recited in claim 1, wherein the second barrier layer is more thickly deposited on an upper surface and corners of each bit line pattern than at sidewalls of each bit line pattern.

10. The method as recited in claim 1, wherein at the step (e) of etching the first and the second barrier layers and the remaining first inter-layer insulation layer, a spacer is simultaneously formed with the first inter-layer insulation layer at the sidewalls of each bit line pattern.

11. A method for fabricating a semiconductor device, comprising the steps of:
    (a) forming first and second bit line patterns that defines a first trench therebetween, each bit line pattern including a wire and a hard mask sequentially stacked over a substrate structure;
    (b) forming a first barrier layer and a first inter-layer insulation layer along a profile containing the first and second bit line patterns and filling the first trench between the bit line patterns, the first inter-layer insulation layer being provided over the first barrier layers, wherein an upper surface of a portion of the first barrier layer provided between the bit line patterns is below upper surfaces of the bit line patterns;
    (c) etching the first inter-layer insulation layer until a second trench is defined between the first and second bit line patterns without exposing the first barrier layer provided between the first and second bit line patterns;
    (d) forming a second baffler layer over the first inter-layer insulation layer and the first barrier layer and into the second space; and
    (e) etching the first and the second barrier layers and the first inter-layer insulation layer to expose a surface of the substrate structure disposed between the first and second bit line patterns, the surface being provided directly below the second space.

12. The method as recited in claim 11, further comprising the steps of performing a wet cleaning/etching process with use of the first barrier layer as an etch barrier layer after the step of (c).

13. The method as recited in claim 11, wherein the step of (c) includes the steps of:
   (c-1) forming a storage node contact mask on the second inter-layer insulation layer; and
   (c-2) performing a partial SAC etching process to the second inter-layer insulation layer with use of the storage node contact mask as an etch mask.

14. The method as recited in claim 13, wherein the partial SAC etching process is carried out at a pressure of about 15 mtorr to about 50 mtorr with a supplied power in range from about 1000 W to about 2000 W and employs an etch gas obtained by combining such gas as $C_4F_8$, $C_5F_8$, $C_4F_6$, $CH_2F_2$, Ar, $O_2$, CO and $N_2$.

15. The method as recited in claim 11, wherein the first barrier layer is formed by employing a low pressure technique and the second barrier layer is formed by employing a plasma deposition technique.

16. The method as recited in claim 15, wherein the second barrier layer is a nitride layer and the nitride layer is deposited with a thickness ranging from about 500 Å to about 2000 Å at a temperature in a range from about 500° C. to about 550° C. by using a source gas of silane (SiH4) and ammonia (NH3).

17. The method as recited in claim 11, wherein the etch-back process employed for etching the second barrier layer is carried out at a pressure of about 15 mtorr to about 50 mtorr with a supplied power in a range from about 1000 W to about 2000 W and employs an etch gas obtained by combining such gas as $C_4F_8$, $C_5F_8$, $C_4F_6$, $CH_2F_2$, Ar, $O_2$, CO and $N_2$.

18. The method as recited in claim 11, wherein the substrate structure includes a plurality of plugs formed on a substrate and a second inter-layer insulation layer.

19. The method as recited in claim 11, wherein the second barrier layer is more thickly deposited on an upper surface and corners of each bit line pattern than at sidewalls of each bit line pattern.

20. The method as recited in claim 11, wherein at the step (e) of etching the first and the second baffler layers and the remaining first inter-layer insulation layer, a spacer is simultaneously formed with the first inter-layer insulation layer at the sidewalls of each bit line pattern.

21. The method as recited in claim 11, wherein the remaining first inter-layer insulation layer is etched to be level with a height of the wire.

22. The method as recited in claim 21, wherein a thickness of the remaining first inter-layer insulation layer ranges from about 1500 Å to about 5000 Å.

23. The method as recited in claim 1, wherein the remaining first inter-layer insulation layer is etched to be level with a height of the wire.

24. The method as recited in claim 23, wherein a thickness of the remaining first inter-layer insulation layer ranges from about 1500 Å to about 5000 Å.

* * * * *